US009545001B2

(12) United States Patent
Goto

(10) Patent No.: US 9,545,001 B2
(45) Date of Patent: Jan. 10, 2017

(54) PRINTED BOARD WITH BOARD TERMINAL AND ELECTRICAL CONNECTION BOX USING SAME

(71) Applicant: Sumitomo Wiring Systems, Ltd, Yokkaichi, Mie (JP)

(72) Inventor: Hideki Goto, Mie (JP)

(73) Assignee: Sumitomo Wiring Systems, Ltd., Yokkaichi, Mie (JP)

(*) Notice: Subject to any disclaimer, the term of this patent is extended or adjusted under 35 U.S.C. 154(b) by 0 days.

(21) Appl. No.: 14/933,495

(22) Filed: Nov. 5, 2015

(65) Prior Publication Data

US 2016/0143138 A1 May 19, 2016

(30) Foreign Application Priority Data

Nov. 14, 2014 (JP) ................................. 2014-231470

(51) Int. Cl.
*H05K 1/11* (2006.01)

(52) U.S. Cl.
CPC ...................................... *H05K 1/11* (2013.01)

(58) Field of Classification Search
None
See application file for complete search history.

(56) References Cited

U.S. PATENT DOCUMENTS

| 3,325,774 A * | 6/1967 | Tucker, Jr. | ............... | H01R 4/34 |
| | | | | 439/737 |
| 5,539,619 A * | 7/1996 | Murakami | ........... | H01R 9/2466 |
| | | | | 361/749 |
| 5,548,488 A * | 8/1996 | Hansen | ................... | H05K 3/326 |
| | | | | 361/796 |
| 5,603,626 A * | 2/1997 | Oka | .................... | H01H 85/2035 |
| | | | | 439/224 |
| 5,624,269 A * | 4/1997 | Kanamori | .............. | H01R 9/091 |
| | | | | 439/474 |
| 5,655,933 A * | 8/1997 | Skowronski | ........... | H01R 31/02 |
| | | | | 29/844 |
| 5,995,380 A * | 11/1999 | Maue | .................. | B60R 16/0238 |
| | | | | 174/254 |
| 6,008,982 A * | 12/1999 | Smith | ................. | B60R 16/0238 |
| | | | | 174/538 |

(Continued)

FOREIGN PATENT DOCUMENTS

| JP | 2003-217437 A | 7/2003 |
| JP | 2006-066123 A | 3/2006 |

*Primary Examiner* — Jeremy C Norris
*Assistant Examiner* — Muhammed Azam
(74) *Attorney, Agent, or Firm* — Dinsmore & Shohl LLP

(57) ABSTRACT

A printed board with board terminal having a novel structure, capable of lowering the support position of an electrical component supported on a printed board and enabling electrical components to be mounted on both sides of the printed board while reducing height, and an electrical connection box using the same is provided. The printed board 34 includes through holes 62 through which tab terminals 76 are inserted. A board terminal 32 includes an insertion hole 38 into which the tab terminal 76 is inserted and a connecting portion 42 projecting inwardly of the insertion hole 38 is pressed into contact with the tab terminal 76. A tab terminal inserting portion 72 is formed by arranging the through hole 62 and the insertion hole 38 such that the through hole 62 and the insertion hole 38 overlap each other in a plan view.

3 Claims, 14 Drawing Sheets

(56) References Cited

U.S. PATENT DOCUMENTS

| | | | | |
|---|---|---|---|---|
| 6,020,562 | A * | 2/2000 | Burns | H05K 1/0216 |
| | | | | 174/260 |
| 6,049,043 | A * | 4/2000 | Tonejc | H01H 50/047 |
| | | | | 174/250 |
| 6,154,373 | A * | 11/2000 | Durston | H05K 1/14 |
| | | | | 174/261 |
| 6,547,572 | B1 * | 4/2003 | Burdick | B60R 16/0238 |
| | | | | 439/76.2 |
| 6,657,133 | B1 * | 12/2003 | Chee | H05K 1/0231 |
| | | | | 174/260 |
| 7,371,080 | B1 * | 5/2008 | Masters | B60R 16/0238 |
| | | | | 439/76.2 |
| 7,645,943 | B2 * | 1/2010 | Horiuchi | H05K 1/0263 |
| | | | | 174/261 |
| 8,587,950 | B2 * | 11/2013 | Ewing | G06F 1/189 |
| | | | | 174/261 |
| 9,035,193 | B2 * | 5/2015 | Kagimura | H05K 1/0263 |
| | | | | 174/251 |
| 2001/0010977 | A1 * | 8/2001 | Murakami | H01R 9/226 |
| | | | | 439/76.2 |
| 2003/0030996 | A1 * | 2/2003 | Shiina | B60R 16/0238 |
| | | | | 361/752 |
| 2003/0133273 | A1 | 7/2003 | Nagaoka | |
| 2005/0136699 | A1 * | 6/2005 | Amini | H05K 1/117 |
| | | | | 439/60 |
| 2005/0164540 | A1 * | 7/2005 | Korsunsky | H05K 7/142 |
| | | | | 439/328 |
| 2011/0111609 | A1 * | 5/2011 | Goto | H01R 12/585 |
| | | | | 439/83 |
| 2012/0034822 | A1 * | 2/2012 | Bopp | H01R 13/6469 |
| | | | | 439/676 |

\* cited by examiner

PRINTED BOARD WITH BOARD TERMINAL AND ELECTRICAL CONNECTION BOX USING SAME

CROSS-REFERENCE TO RELATED APPLICATIONS

This application claims priority of Japanese Patent Application 2014-231470 filed on Nov. 14, 2014.

FIELD OF THE INVENTION

The present invention relates to a printed board having a board terminal configured to connect an electrical component to a conductive path of a printed board and an electrical connection box using the same.

BACKGROUND OF THE INVENTION

Conventionally, a printed board with a board terminal in which the board terminal is connected to a conductive path of a printed board, such as by soldering stands on the printed board, to enable an electrical component such as a fuse or a relay to be connected to the printed board is known.

For example, as described in Japanese Unexamined Patent Publication No. 2003-217437 (patent literature 1), a board terminal having a turning fork shape and including a soldered portion to be inserted into and soldered to a through hole of a printed board on one end side and a connecting portion to be connected to a tab terminal of an electrical component on the other end side is widely used to stand on the printed board. Further, a board terminal including a connecting portion formed with a pair of resilient tongue pieces by bending and deforming a metal plate and configured to sandwich and connect a tab terminal by the pair of resilient tongue pieces is also proposed, for example, in Japanese Unexamined Patent Publication No. 2006-66123 (patent literature 2).

In a conventional printed board with board terminal, an electrical component is electrically conductively connected to a conductive path of a printed board by connecting a tab terminal of the electrical component to a connecting portion of a board terminal standing on the printed board. Accordingly, the electrical component is supported via the board terminal at a position spaced upwardly from the printed board by a height of the board terminal. Also in an electrical connection box accommodating such a printed board with board terminal, a component mounting portion into which the electrical component is mounted is provided at a position spaced upwardly from the printed board by the height of the board terminal.

However, in recent years, packaging space for the electrical component is further limited to meet a request to miniaturize vehicle-mounted electrical components. Accordingly, it may be difficult to accommodate an electrical connection box in a conventional printed board with board terminal having a conventional structure in an allowed packaging space.

Particularly, if it is desired to mount electrical components on both surface sides of the printed board, as board terminals need to stand on both surfaces of the printed board, thereby causing a further height increase of the board terminals. Thus, it has become more difficult to reduce a height of the entire printed board with board terminal and a height of an electrical connection box accommodating the printed board with board terminal.

SUMMARY OF THE INVENTION

The present invention was developed in response to the above situation and aims to provide a printed board with board terminal having a novel structure, capable of lowering the support position of an electrical component supported on a printed board via a board terminal and enabling electrical components to be mounted on both surface sides of the printed board while reducing a height, and an electrical connection box using the same.

A first aspect of the a printed board with a board terminal is directed to a printed board with a board terminal, for connecting an electrical component to a conductive path of a printed board, is mounted on the printed board, wherein the printed board includes a through hole into which a tab terminal of the electrical component is inserted. The board terminal includes an insertion hole into which the tab terminal of the electrical component is inserted and a connecting portion which projects inwardly of the insertion hole and is pressed into contact with the tab terminal, and a tab terminal inserting portion, including the through hole and the insertion hole, is formed by arranging the through hole of the printed board and the insertion hole of the board terminal such that the through hole and the insertion hole overlap each other in a plan view.

According to this aspect, the printed board includes the through hole into which the tab terminal is inserted, and the tab terminal insertion hole of the board terminal mounted on such a board terminal is arranged to overlap the through hole in a plan view. This enables the tab terminal of the electrical component to be connected to the connecting portion by being inserted into the insertion hole of the board terminal through the through hole of the printed board from one surface side of the printed board on which the board terminal does not stand. In this way, the support position of the electrical component supported on the printed board can be lowered since the board terminal is provided on the other surface side of the printed board.

Further, if it is desired to mount electrical components on both surface sides of the printed board, the tab terminal of the electrical component can be inserted into the insertion hole of the board terminal and connected to the connecting portion as before on the other surface side, and the tab terminal of the electrical component can be connected to the board terminal through the through hole of the printed board on one of the surface sides. Thus, the board terminals have only to stand only on the other of the surface sides of the printed board unlike a conventional structure in which the board terminals need to stand on the both surfaces of the printed board, and a height of the printed board with board terminal can be drastically reduced.

Note that the mounting of the board terminal on the printed board means that a soldered portion or a pressure-contact conductive portion of the board terminal is electrically conductively connected to the conductive path of the printed board by soldering or pressure contact.

According to a second aspect of the printed board with a board terminal, the printed board includes a press-fit hole in the periphery of the through hole, the board terminal includes a press-fit tab, and the board terminal is positioned and held on the printed board by press-fitting the press-fit tab into the press-fit hole.

According to this second aspect, the board terminal can be positioned and held on the printed board by press-fitting the press-fit tab of the board terminal into the press-fit hole of the printed board. Thus, an operation such as the soldering of the board terminal to the printed board can be efficiently performed. Further, in the case of connecting the board terminal to the conductive path of the printed board by pressure contact, the board terminal can be stably held at a predetermined pressure-contact position so as to help ensure conduction stability.

According to a third aspect of the printed board with a board terminal according to the second aspect, the printed board includes a land portion conductive to the conductive path, the board terminal includes a soldered portion to be placed on the land portion and the soldered portion is placed on and soldered to the land portion.

According to this third aspect, the soldered portion of the board terminal can be held placed on the land portion of the printed board with the press-fit tab of the board terminal press-fit in the press-fit hole of the printed board, whereby reflow soldering can be advantageously and reliably performed.

According to a fourth aspect of the printed board with a board terminal, the board terminal includes a rectangular tube body portion, the insertion hole is formed by the interior of the rectangular tube body portion, a pair of facing side walls of the rectangular tube body portion include a pair of resilient tongue pieces projecting inwardly and configured to be pressed into contact with the tab terminal from opposite sides in a thickness direction of the tab terminal to form the connecting portion, board placing portions projecting outwardly in a direction perpendicular to the pair of facing side walls of the rectangular tube body portion and the soldered portion is formed by at least a part of the board placing portion. The board placing portions are disposed on a base end part of the rectangular tube body portion.

According to this fourth aspect, the insertion hole into which the tab terminal is inserted is formed by the rectangular tube body portion of the board terminal, and the pair of resilient tongue pieces (connecting portion) to be pressed into contact with the tab terminal from the opposite sides along the direction of the thickness of the board terminal are formed by the pair of facing side walls of the rectangular tube body portion. Thus, a reduction of insertion resistance of the tab terminal into the connecting portion and connection stability between the tab terminal and the connecting portion are achieved. Further, the board placing portions projecting outwardly in the direction perpendicular to the side walls are provided on the base end parts of the pair of facing side walls where the pair of resilient tongue pieces are provided. This enables an insertion force of the tab terminal to be reliably supported by the board placing portions and the board terminal to be stably supported on the printed board. In addition, since the soldered portions utilize parts of the board placing portions, a reduction in the number of components and a strengthening of a fixing force of the board terminal to the printed board are also achieved.

According to a fifth aspect of the printed board with a board terminal according to the second aspect, the printed board includes a conduction hole, the conductive path is exposed on an inner peripheral surface of the conduction hole, the board terminal includes a pressure-contact conductive portion, and the pressure-contact conductive portion is pressed into contact with and connected to the conductive path by being inserted into the conduction hole.

According to this fifth aspect, the board terminal can be connected to the conductive path of the printed board by inserting the pressure-contact conductive portion of the board terminal into the conduction hole of the printed board and pressing the pressure-contact conductive portion of the board terminal into contact with the conductive path, eliminating the need for soldering so as to reduce cost and simplify manufacturing.

According to a sixth aspect of the printed board with board terminal according to the fifth aspect, the board terminal includes a rectangular tube body portion, the insertion hole is formed by the interior of the rectangular tube body portion, a pair of facing side walls of the rectangular tube body portion include a pair of resilient tongue pieces projecting inwardly and to be pressed into contact with the tab terminal from opposite sides in a thickness direction of the tab terminal to form the tab terminal conductive portion, board placing portions projecting outwardly in a direction perpendicular to the pair of facing side walls of the rectangular tube body portion are provided on a base end part of the rectangular tube body portion, and the pressure-contact conductive portion is provided to project on a projecting end part of the board placing portion.

According to this sixth aspect, as in the fourth aspect, a reduction of insertion resistance of the tab terminal into the connecting portion and connection stability between the tab terminal and the connecting portion can be combined and the board terminal can be stably supported on the printed board by reliably supporting an insertion force of the tab terminal by the board placing portions. In addition, since the pressure-contact conductive portions are provided on the projecting end parts of the board placing portions, the strengthening of the fixing force of the board terminal to the printed board can be also realized, taking advantage of press-fit forces of the pressure-contact conductive portions into the conduction holes.

According to a seventh aspect of the printed board with board terminal according to any one of the third, fourth, fifth or sixth aspects, the board placing portions are provided on one pair of diagonal parts of the pair of facing side walls of the rectangular tube body portion.

According to this seventh aspect, since the board placing portions are provided on the one pair of diagonal parts of the pair of facing side walls of the rectangular tube body portion, even if formation areas of the board placing portions are limited, the board terminal can be stably supported on the printed board. Further, by limiting the formation areas of the board placing portions to the one pair of diagonal parts, the board terminal can be simplified and board terminals can be arranged at narrow intervals.

An electrical connection box is also provided. According to a first aspect of the electrical connection box, a printed board with a board terminal is accommodated in a case, wherein the printed board with board terminal of any one of the first to seventh aspects is used, the case includes a first cover portion for covering a first surface of the printed board on which the board terminal does not stand and a second cover portion for covering a second surface of the printed board on which the board terminal stands, and a component mounting portion, into which the electrical component to be connected to the conductive path of the printed board is mounted, is provided on a surface of the first cover portion and the tab terminal of the electrical component mounted in the component mounting portion is inserted into the insertion hole of the board terminal through a tab insertion hole to penetrate through a bottom wall of the component mounting portion and a through hole of the printed board.

According to this aspect, by accommodating the printed board with a board terminal of any one of the first to seventh aspects into the case of the electrical connection box, a separation distance between the first surface of the printed board on which the board terminal does not stand and the first cover of the case covering the first surface can be reduced because of the absence of the board terminal. In addition, the board terminal standing on the second surface of the printed board can be originally accommodated, taking advantage of a clearance between the second surface and the second cover portion covering the second surface. Thus, a height of the electrical connection box can be reduced as a whole. Particularly, also if it is desired to mount electrical components on both first and second surfaces of the printed board, the electrical components can be mounted only by providing the board terminals standing on the second surface, wherefore the height of the electrical connection box can be more advantageously reduced.

According to a second aspect of the present invention of the electrical connection box, in the electrical connection box according to the first aspect, the second cover portion is in contact with a projecting end surface of the board terminal standing on the second surface of the printed board and the board terminal is held between the second surface of the printed board and the second cover portion.

According to this second aspect, if it is desired to mount the electrical component only on the first surface side of the printed board, the board terminal standing on the second surface can be directly supported between the second cover portion and the second surface. Thus, an insertion/removal force applied to the board terminal when the electrical component is mounted can be advantageously supported.

The printed board includes the through hole into which the tab terminal is inserted, and the tab terminal insertion hole of the board terminal mounted on such a printed board is arranged to overlap the through hole in a plan view. This enables the tab terminal of the electrical component to be connected to the connecting portion by being inserted into the through hole and the insertion hole from the one surface side of the printed board on which the tab terminal does not stand. As a result, the support position of the electrical component can be reduced since the board terminal is provided on the other surface side of the printed board. Further, also if it is desired to mount electrical components on the both surface sides of the printed board, the tab terminal of the electrical component can be connected to the board terminal through the through hole of the printed board on the one surface side. Thus, the board terminals have only to stand only on the other surface side of the printed board unlike a conventional structure in which the board terminals need to respectively stand on the both surface sides of the printed board, and the height of the printed board with board terminal can be drastically reduced.

DETAILED DESCRIPTION OF THE PREFERRED EMBODIMENTS

Hereinafter, aspects of the present invention are described with reference to the drawings.

Figure 1:
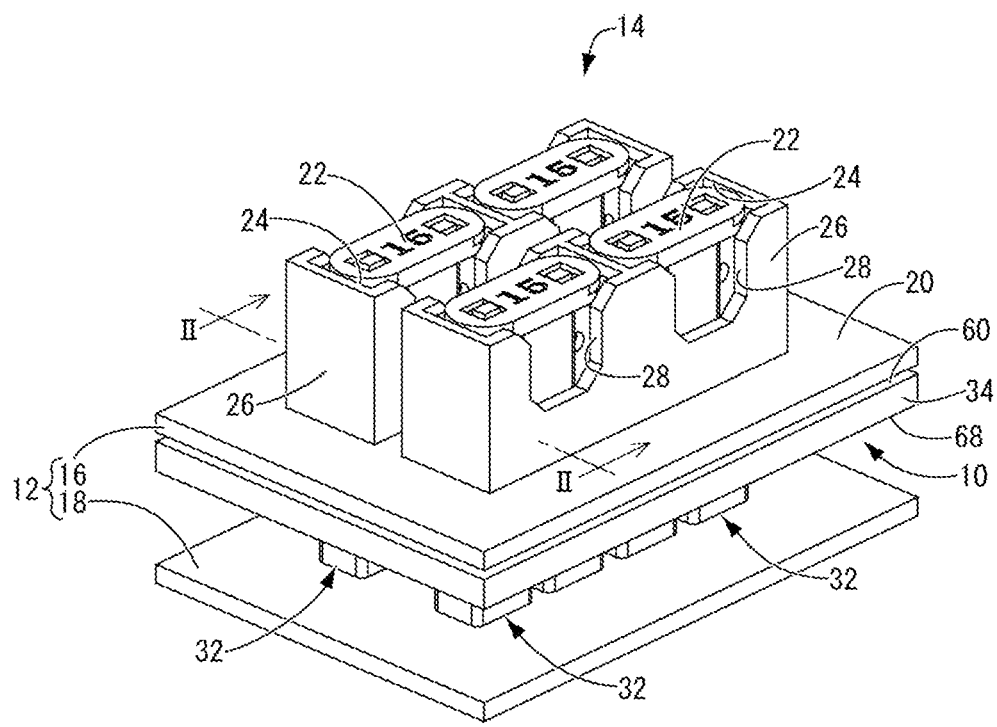
FIG. 1 is a perspective view showing an electrical connection box accommodating a printed board with board terminal as a first aspect of the present invention.
Figure 2:
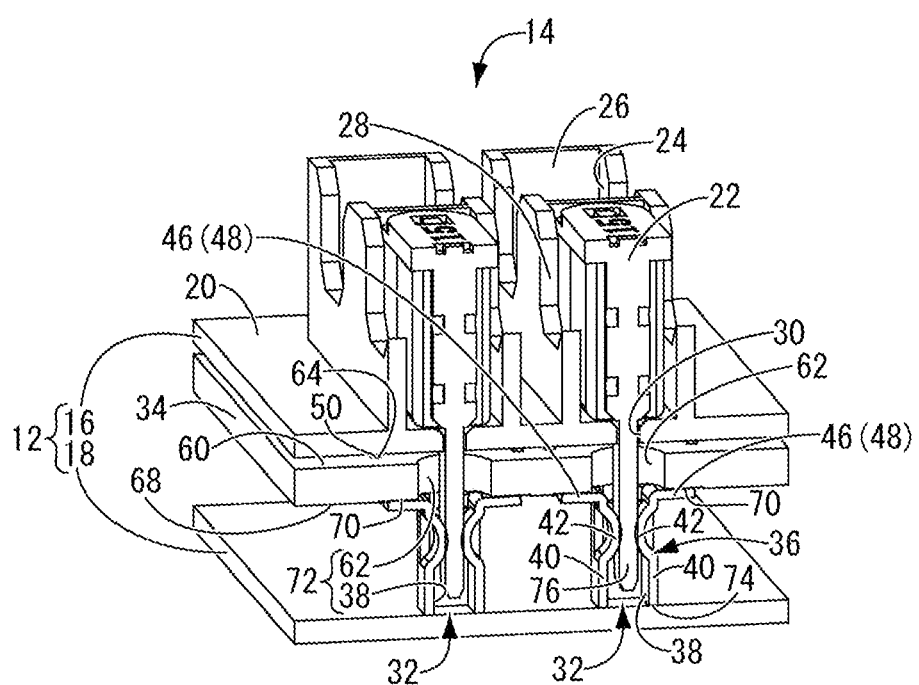
FIG. 2 is a perspective view in section along II-II of FIG. 1.
Figure 3:
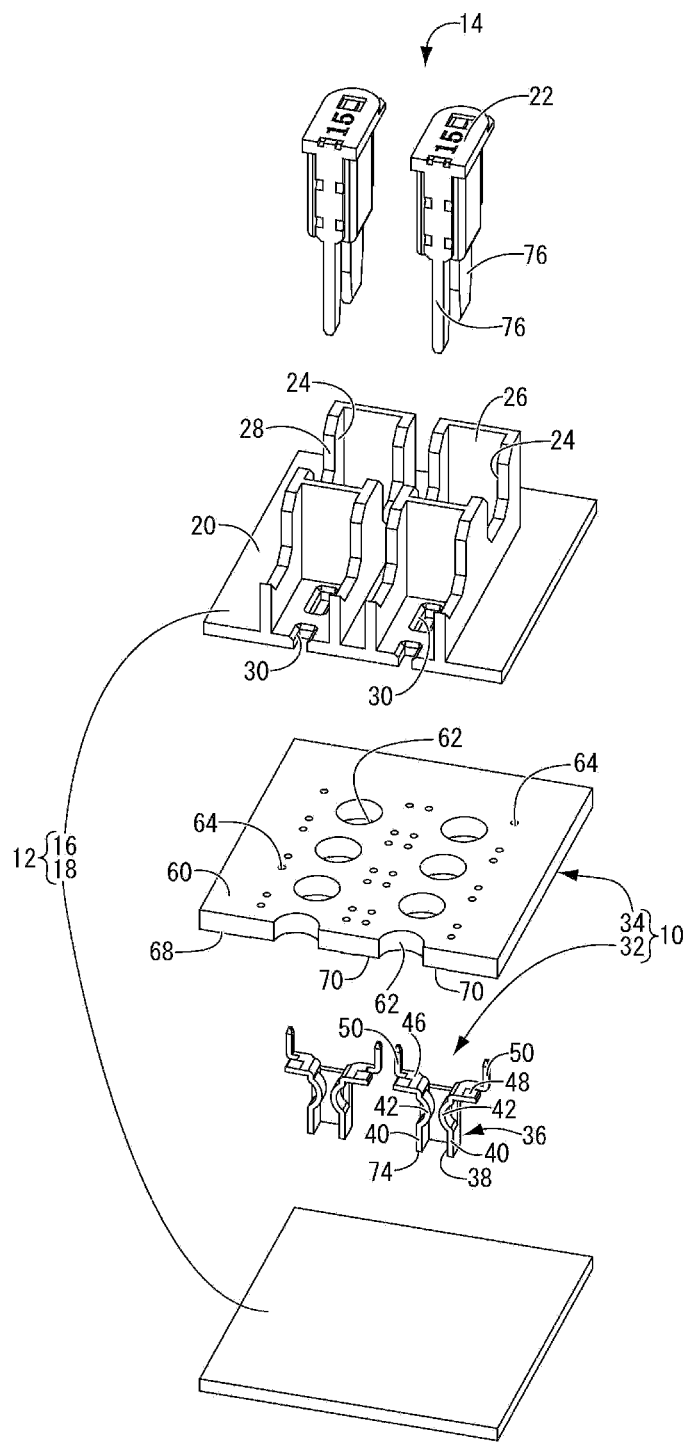
FIG. 3 is an exploded perspective view of the electrical connection box shown in FIG. 2.

With reference first to FIGS. 1 to 3, an electrical connection box 14 obtained by accommodating a printed board with a board terminal 10 as a first aspect of the present invention in a case 12 is provided. Note that, in the following description, upper and lower sides in FIG. 1 are referred to as upper and lower sides and left and right sides in FIG. 1 are referred to as front and rear sides.

The case 12 is configured to include a first cover portion 16 and a second cover portion 18, which may both be integrally formed by injection molding using, for example, synthetic resin such as polypropylene (PP) or polyamide (PA). The first and second cover portions 16, 18 have, for example, a substantially shallow and rectangular box shape and are open toward mating sides. By assembling the cover portions 16, 18 with opening parts thereof placed one over the other, the electrical connection box 14 accommodating the printed board with a board terminal 10 in the case 12 is provided. Note that the case 12 is assembled, for example, by inserting and engaging unillustrated locking claws provided on the first cover portion 16 into and with unillustrated engaging frames provided at corresponding positions of the second cover portion 18.

As shown in FIGS. 1 to 3, a plurality of (four in this aspect) component mounting portions 24 into which fuses 22 as electrical components are mounted are disposed on a surface 20 of the first cover portion 16. Each component mounting portion 24 is configured to include a peripheral wall portion 26 substantially in the form of a rectangular box open upward, and cut portions 28 substantially rectangular in a side view are formed on parts of a peripheral wall facing each other and spaced apart from each other along a width direction (lateral direction in FIG. 2). This enables the fuse 22 to be easily inserted into and removed from the component mounting portion 24. Further, a pair of tab insertion holes 30 are formed on a bottom wall of each component mounting portion 24 and penetrate each of the component mounting portions 24 along a plate thickness direction and have a substantially rectangular cross-section.

Figure 4:
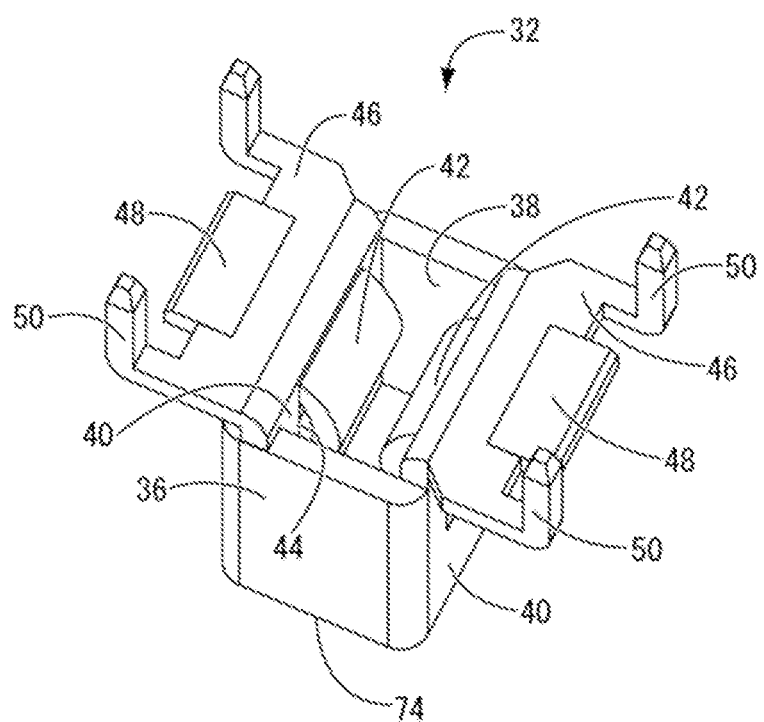
FIG. 4 is a perspective view of a board terminal shown in FIG. 1.
Figure 5:
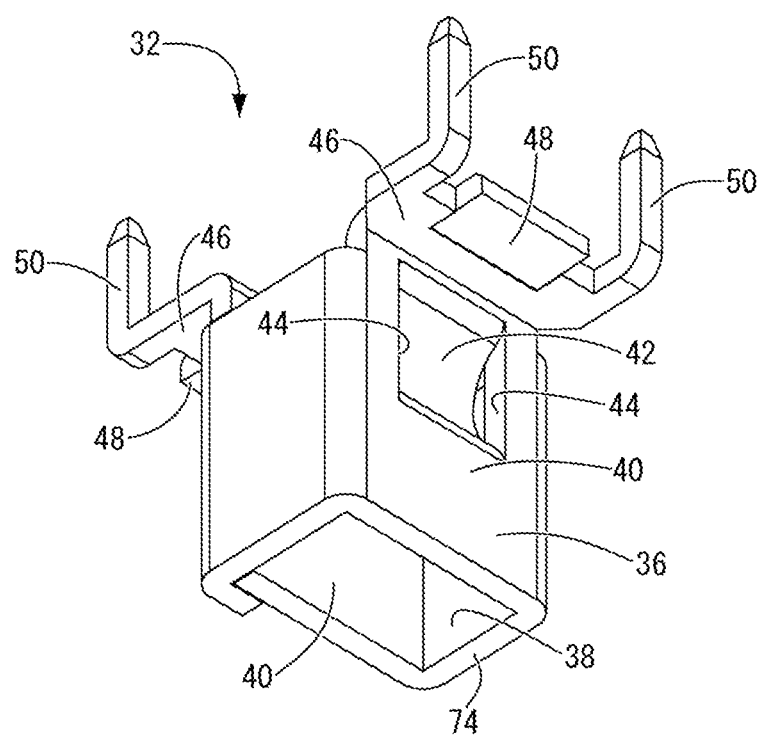
FIG. 5 is a perspective view of the board terminal shown in FIG. 4 when viewed in another direction.

As shown in FIGS. 1 to 3, the printed board with a board terminal 10 is configured by mounting a plurality of (eight in this aspect) board terminals 32 on a printed board 34. More specifically, the board terminal 32 is formed by press-punching a metal plate obtained, for example, by applying tin-plating or the like to surfaces of a copper plate or the like and bending a press-punched piece. As shown in FIGS. 4 and 5, such a board terminal 32 includes a rectangular tube body portion 36 substantially in the form of a rectangular tube and an insertion hole 38 is formed by the interior of such a vertically open rectangular tube body portion 36. Further, a pair of resilient tongue pieces 42 are formed on base end sides (upper sides in FIGS. 2 and 4) of a pair of facing side walls 40, 40 of the rectangular tube body portion 36. The pair of resilient tongue pieces 42 project inwardly into the insertion hole 38 and constitute a connecting portion. The pair of resilient tongue pieces 42 face each other in a width direction (lateral direction in FIGS. 2 and 4). Such a resilient tongue piece 42 is formed by causing a part between a pair of slits 44, 44 extending in parallel to the vertical direction so as to project inwardly of the rectangular tube body portion 36 with upper and lower end parts coupled to the facing side wall 40 (see FIG. 5).

Further, board placing portions 46 are disposed on a base end part (upper part in FIGS. 1 to 5) of the rectangular tube body portion 36. The board placing portions 46 are substantially rectangular flat plates projecting outwardly in a direction perpendicular to the pair of facing side walls 40, 40 of the rectangular tube body portion 36. Furthermore, a soldered portion 48 is formed in a central part of the board placing portion 46. Note that the soldered portion 48 is placed on and soldered to a land portion 70 of the printed board 34 to be described later. In addition, press-fit tabs 50 are disposed on opposite end parts of a projecting tip part of the board placing portion 46. The press-fit tabs 50 are substantially rectangular flat plates projecting in a direction perpendicular to the board placing portion 46 and away from the rectangular tube body portion 36.

Figure 6A:
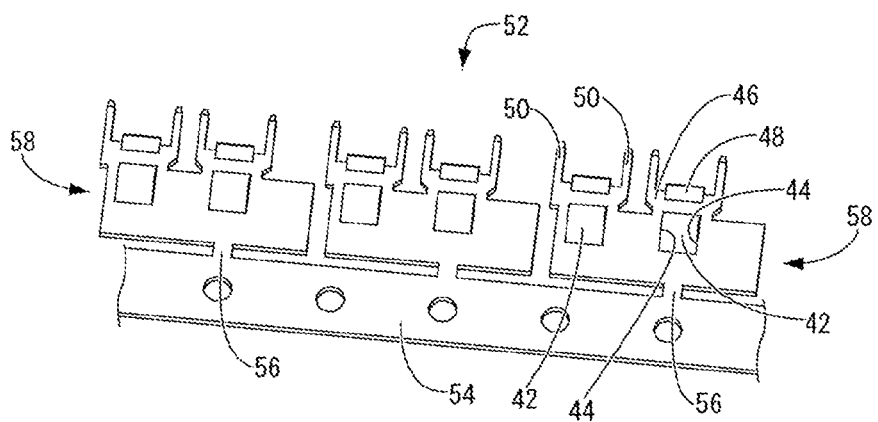
FIG. 6A is a perspective view of a board terminal shown in FIG. 4 after a press-punching process.
Figure 6B:
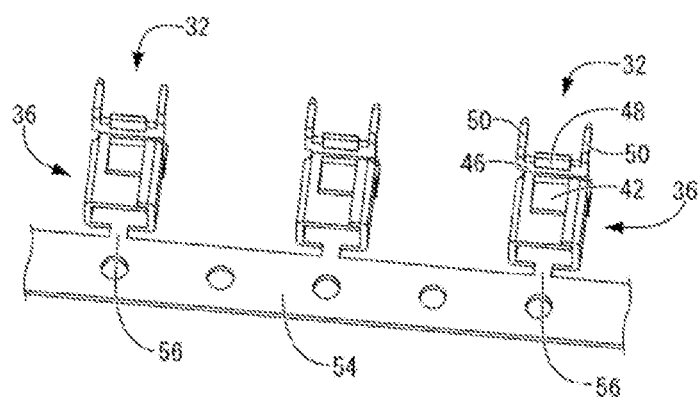
FIG. 6B is a perspective view of the board terminal shown in FIG. 6A after assembling.

Note that the board terminal 32 can be formed using a flat plate member 52 formed by press-punching a metal plate obtained by applying tin-plating or the like to surfaces of a copper plate or the like as shown in FIG. 6A. In FIG. 6A, each resilient tongue piece 42 between the pair of slits 44, 44 is extruded forward. Using such a flat plate member 52, the board placing portions 46 are first bent in a direction perpendicular to the flat plate member 52 (backward in FIG. 6A) and, subsequently, the press-fit tabs 50 are bent in a direction parallel to the flat plate member 52 (upward in FIGS. 6A and 6B). Subsequently, each flat plate member 58 connected to a carrier portion 54 via a bridge portion 56 is bent inwardly (toward the front side in FIGS. 6A and 6B) into a rectangular tube shape, whereby a plurality of board terminals 32 are formed in a chain-like manner as shown in FIG. 6B.

On the other hand, as shown in FIG. 3, a plurality of (eight in this aspect) through holes 62 having a substantially circular cross-section are disposed on a first surface 60 of the printed board 34. Each through hole 62 penetrates the printed board 34 in a plate thickness direction. Further, four press-fit holes 64 are disposed on the periphery of each of such through holes 62, each of the press-fit holes 64 penetrate the printed circuit board 34. Furthermore, unillustrated conductive paths of the printed board 34 are connected to inner walls forming the through holes 62. In addition, as shown in FIGS. 2 and 3, the land portions 70 formed of, for example, copper foils are provided on a second surface 68 of the printed board 34 and connected to the unillustrated conductive paths of the printed board 34 via the inner walls of the through holes 62.

By mounting the board terminals 32 on the thus structured printed board 34, the printed board with board terminal 10 is configured (see FIGS. 2 and 3). More specifically, the press-fit tabs 50 of the board terminal 32 are press-fit into the press-fit holes 64 of the printed board 34 from the side of the second surface 68 of the printed board 34. In this way, the board terminal 32 is positioned and fixed at a predetermined position of the printed board 34 and the through hole 62 of the printed board 34 and the insertion hole 38 of the board terminal 32 are so positioned and arranged as to overlap each other in a plan view. Then, a tab terminal inserting portion 72 including the through hole 62 and the insertion hole 38 is formed (see FIG. 2). Since the board terminal 32 is held positioned on the printed board 34 in this way, a subsequent operation such as the soldering of the board terminal 32 to the printed board 34 can be efficiently performed. The soldered portions 48 of the board terminal 32 are reflow-soldered to the land portions 70 in such a held state, i.e. in a state where the soldered portions 48 are placed on the land portions 70. As just described, the soldered portions 48 of the board terminal 32 can be reflow-soldered while being held in place on the land portions 70, wherefore reflow soldering can be advantageously and reliably performed. As a result, the board terminal 32 is connected to the unillustrated conductive path of the printed board 34 via the soldered portions 48 and the land portions 70.

Subsequently, the printed board with a board terminal 10 thus configured is accommodated into the case 12, thereby configuring the electrical connection box 14. More specifically, as shown in FIG. 1, the first cover portion 16 is arranged to cover the first surface 60 of the printed board 34 on which the board terminals 32 do not stand, whereas the second cover portion 18 is arranged to cover the second surface 68 of the printed board 34 on which the board terminals 32 stand. Then, by assembling the first and second cover portions 16, 18, the electrical connection box 14 accommodating the printed board with a board terminal 10 in the case 12 composed of the first and second cover portions 16, 18 is provided. Here, the printed board with a board terminal 10 is positioned and held between the first and second cover portions 16, 18 while being proximate to the first cover portion 16. Further, projecting end surfaces 74 of the board terminals 32 standing on the second surface 68 of the printed board 34 are in contact with the second cover portion 18 and the board terminals 32 are held between the second surface 68 of the printed board 34 and the second cover portion 18. As a result, an insertion/removal force applied to the board terminal 32 when the fuse 22 is mounted can be advantageously supported.

Finally, by mounting the fuses 22 into the electrical connection box 14 thus configured, the electrical connection box 14 is completed. More specifically, as shown in FIGS. 1 to 3, the fuse 22 is mounted into the component mounting portion 24 of the first cover portion 16 with the tab terminals 76 in the lead. This causes the pair of tab terminals 76 of the fuse 22 mounted into the component mounting portion 24 to be inserted into the insertion holes 38 of the board terminals 32 through the tab insertion holes 30 and the through holes 62 of the printed board 34 (see FIG. 2). As a result, the pair of resilient tongue pieces 42 are pressed into contact with each tab terminal 76 from opposite sides in a direction along the thickness of the plate of the tab terminal 76 of the fuse 22. In this way, the tab terminals 76 of the fuse 22 are electrically conductively connected to the unillustrated conductive paths of the printed board 34 via the board terminals 32.

According to the printed board with a board terminal 10 structured as described above, the through holes 62 are provided to penetrate through the printed board 34, whereas the insertion holes 38 of the board terminals 32 are arranged to overlap the through holes 62 in a plan view. This enables the tab terminals 76 of the fuse 22 to be connected to the resilient tongue pieces 42 of the board terminals 32 by being inserted into the through holes 62 of the printed board 34 and the insertion holes 38 of the board terminals 32 from the side of the first surface 60 on which the board terminals 32 of the printed board 34 do not stand. Here, since no board terminal 32 stands on the first surface 60 of the printed board 34 on which the fuses 22 are mounted, a height of the printed board with board terminal 10 can be reduced by that much.

Further, the insertion hole 38 into which the tab terminal 76 is inserted is formed by the rectangular tube body portion 38 of the board terminal 32 and the board terminal 32 is connected to the tab terminal 76 by pressing the pair of resilient tongue pieces 42 into contact with the tab terminal 76. Thus, a reduction in insertion resistance of the tab terminal 76 and connection stability are achieved. Further, since the board placing portions 46 project outwardly in the perpendicular direction are disposed on the base end parts of the pair of facing side walls 40, 40 of the rectangular tube body portion 36, the board terminal 32 can be stably supported on the printed board 34 by reliably supporting the insertion force of the tab terminal 76 by the board placing portions 46. In addition, since the soldered portions 48 are formed, utilizing parts of the board placing portions 46, a reduction in the number of components and the strengthening of a fixing force of the board terminal 32 to the printed board 34 are also achieved.

In addition, in the case of accommodating the printed board with a board terminal 10 of this aspect into the case 12 of the electrical connection box 14, a separation distance between the first surface 60 of the printed board 34 on which no board terminal 32 stands and the first cover portion 16 covering the first surface 60 can be reduced because of the absence of the board terminals 32. Further, the board terminals 32 standing on the second surface 68 of the printed board 34 can be accommodated, utilizing the present clearance between the second surface 68 of the printed board 34 and the second cover portion 18. Thus, a height of the electrical connection box 14 can be reduced as a whole.

Figure 7:
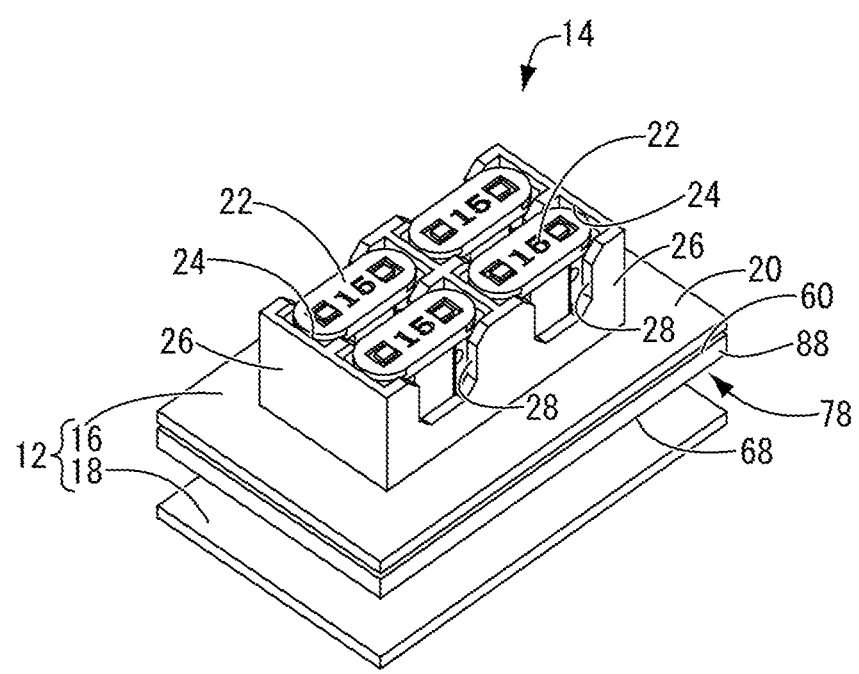
FIG. 7 is a perspective view showing an electrical connection box accommodating a printed board with board terminal as a second aspect of the present invention.
Figure 8:
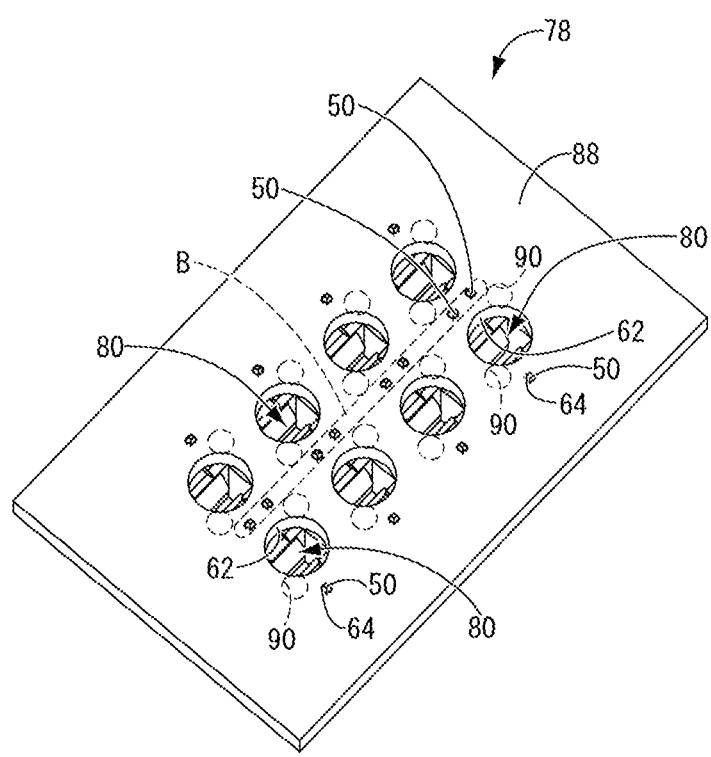
FIG. 8 is a perspective view showing the printed board with board terminal of the second aspect.
Figure 9:
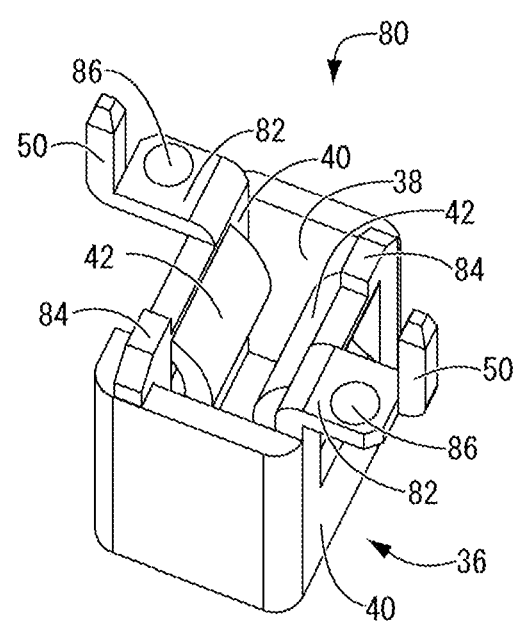
FIG. 9 is a perspective view of a board terminal shown in FIG. 8.

With reference now to FIGS. 7 through 9, another aspect of a printed board with a board terminal 78 is provided. Members and parts structured similarly to the above aspect are denoted by the same reference signs as in the above aspect and not described in detail. Such a printed board with board terminal 78 shows an aspect different from the above first aspect in that board placing portions 82 of a board terminal 80 are provided on one pair of diagonal parts of a pair of facing side walls 40 of a rectangular tube body portion 36 (see FIG. 9). Specifically, the board placing portions 82 are substantially rectangular flat plates projecting outwardly in a direction perpendicular to the pair of facing side walls 40 and are disposed on base end parts (upper sides in FIG. 9) of the one pair of diagonal parts of the pair of facing side walls 40 of the rectangular tube body portion 36 of the board terminal 80. On the other hand, board placing leg portions 84 projecting upwardly from the facing side walls 40 are disposed on base end parts of the other pair of diagonal parts of the pair of facing side walls 40. A dome-shaped soldered portion 86 projecting upwardly is disposed in a central part of the board placing portion 82, and placed on and soldered to a land portion 90 (see FIG. 8) of a printed board 88 to be described later. Note that since projecting distances of the board placing leg portions 84 and the board placing portions 82 from the rectangular tube body portion 36 are substantially equal, the rectangular tube body portion 36 can be stably placed on the printed board 88 to be described later. Further, a press-fit tab 50 being of a substantially rectangular flat plate projecting in a direction perpendicular to the board placing portion 82 and away from the rectangular tube body portion 36 is disposed on a projecting tip part of the board placing portion 82.

In addition, in this aspect, two press-fit holes 64 are provided to penetrate in the periphery of each of through holes 62 provided on a first surface 60 of the printed board 88. Further, as shown in FIG. 8, the land portions 90 formed of, for example, copper foils are provided on a second surface 68 of the printed board 88, and connected to unillustrated conductive paths of the printed board 88 via the inner walls of the through holes 62. The soldered portions 86 of the board terminal 80 are placed on and soldered to the land portions 90 of the printed board 88, whereby the board terminal 80 is connected to the unillustrated conductive path of the printed board 88.

According to this aspect, since the board placing portions 82 of the board terminal 80 are provided on the one pair of diagonal parts of the pair of facing side walls 40 of the rectangular tube body portions 36, the board terminal 80 can be stably supported on the printed board 88 even if formation areas of the board placing portions 82 are limited to the one pair of diagonal parts. Further, by limiting the formation areas of the board placing portions 82 to one of the pair of diagonal parts, the board terminals 80 can be simplified and arranged at narrow intervals. Specifically, since the board placing portions 82 of each board terminal 80 are provided only on the one pair of diagonal parts, the press-fit tabs 50, 50 arranged between a lower fuse row and an upper fuse row are provided at positions not overlapping each other in a direction perpendicular to each fuse row as shown in FIG. 8. Thus, as shown in an area enclosed by a broken line "B" of FIG. 8, the press-fit tabs 50, 50 located between the upper and lower fuse rows can be aligned on the same straight line and a separation distance between the lower and upper fuse rows can be reduced.

Figure 10:
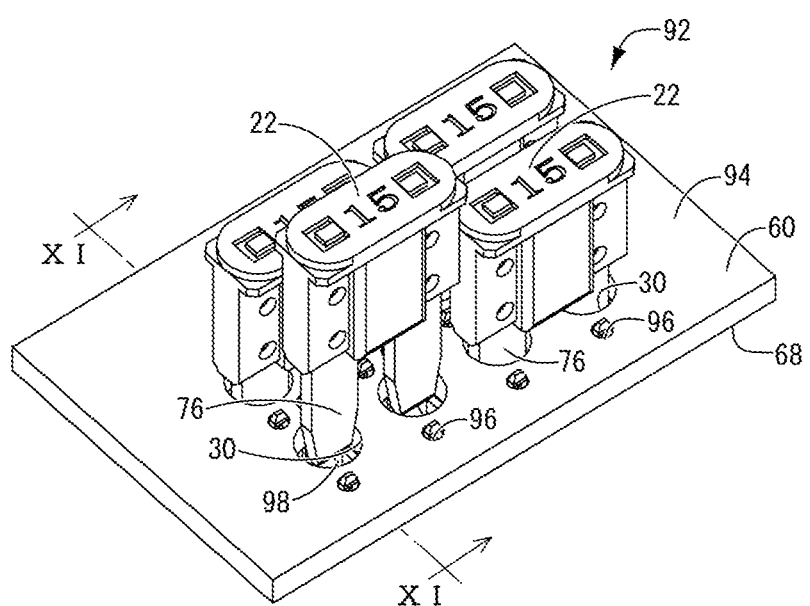
FIG. 10 is a perspective view showing a printed board with board terminal as a third aspect of the present invention.
Figure 11:
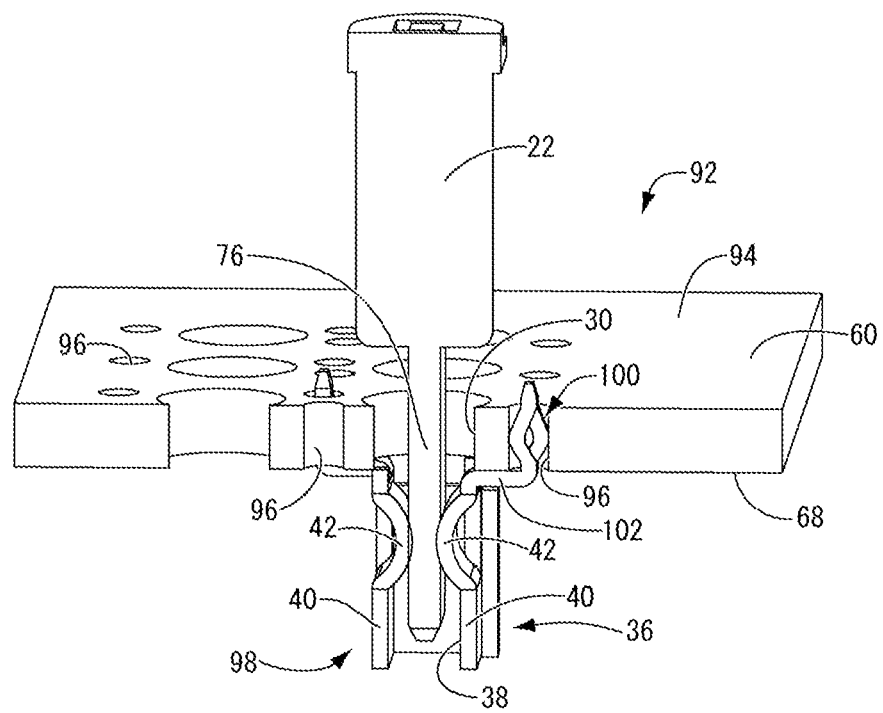
FIG. 11 is a perspective view in section along XI-XI of FIG. 10.
Figure 12:
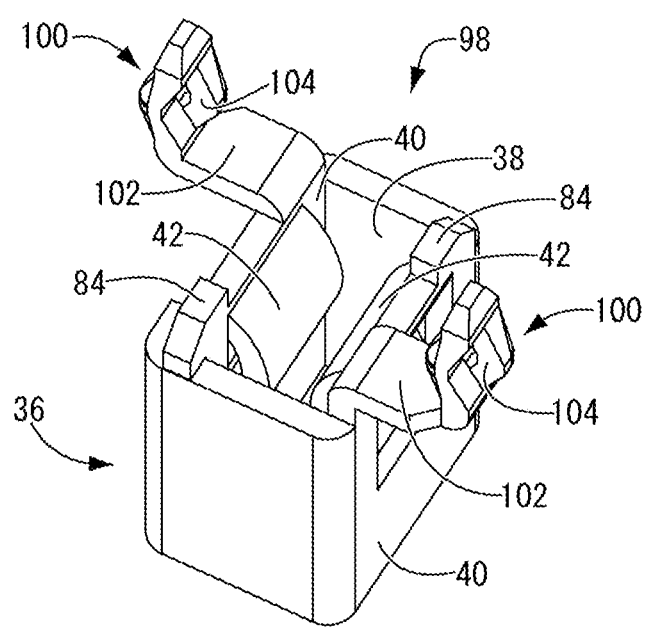
FIG. 12 is a perspective view showing a board terminal used in the third aspect.

With reference now to FIGS. 10 through 12, a third aspect of a printed board with board terminal 92 is provided. Note that a case 12 is not shown in FIGS. 10 and 11 to facilitate understanding. The printed board with board terminal 92 differs in configuration from the above second aspect in that a printed board 94 includes conduction holes 96 on whose inner peripheral surfaces unillustrated conductive paths are exposed, whereas a board terminal 98 includes pressure-contact conductive portions 100. Specifically, as shown in FIG. 12, board placing portions 102 are substantially rectangular flat plates projecting outwardly in a direction perpendicular to a pair of facing side walls 40 are provided on base end parts of one pair of diagonal parts of the pair of facing side walls 40 of a rectangular tube body portion 36 of the board terminal 98. On the other hand, board placing leg portions 84 projecting upwardly from the facing side walls 40 are provided on base end parts of the other pair of diagonal parts of the pair of facing side walls 40. Since projecting distances of the board placing leg portions 84 and the board placing portions 102 from the rectangular tube body portion 36 are substantially equal here, the board terminal 98 can be stably placed on the printed board 94. Further, the pressure-contact conductive portions 100 projecting in a direction perpendicular to the board placing portions 102 and away from the rectangular tube body portion 36 are provided on projecting tip parts of the board placing portions 102. More specifically, the pressure-contact conductive portion 100 is formed by extruding parts at opposite sides of a slit extending in a projecting direction in a central part thereof in mutually opposite directions along a plate thickness direction.

In addition, in this aspect, two conduction holes 96 having a substantially circular cross-section are provided to penetrate in the periphery of each of through holes 62 provided on a first surface of the printed board 88 as shown in FIGS. 10 and 11. Unillustrated conductive paths of the printed board 94 are connected to the inner peripheral surfaces of such conduction holes 96. The pressure-contact conductive portion 100 of the board terminal 98 is pressed into contact with and connected to the unillustrated conductive path of the printed board 94 via the inner peripheral surface of the conduction hole 96 by being inserted into the conduction hole 96 of the printed board 94 (see FIG. 11).

According to this aspect, the pressure-contact conductive portion 100 of the board terminal 98 can be connected to the unillustrated conductive path of the printed board 94 only by being inserted into the conduction hole 96 of the printed board 94. Since this can eliminate the need for soldering, a cost reduction and the simplification of a manufacturing facility can be realized. Further, the strengthening of a fixing force of the board terminal 98 to the printed board 94 can also be realized, taking advantage of a press-fit force of the pressure-contact conductive portion 100 into the conduction hole 96.

Figure 13:
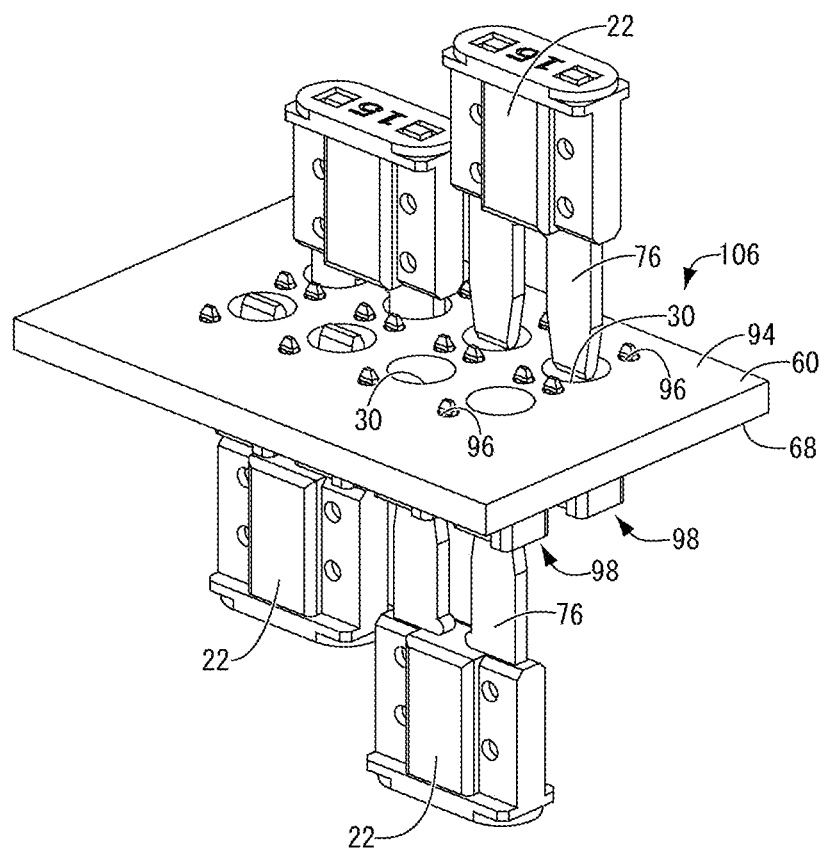
FIG. 13 is a perspective view showing a printed board with board terminal as a fourth aspect of the present invention.
Figure 14:
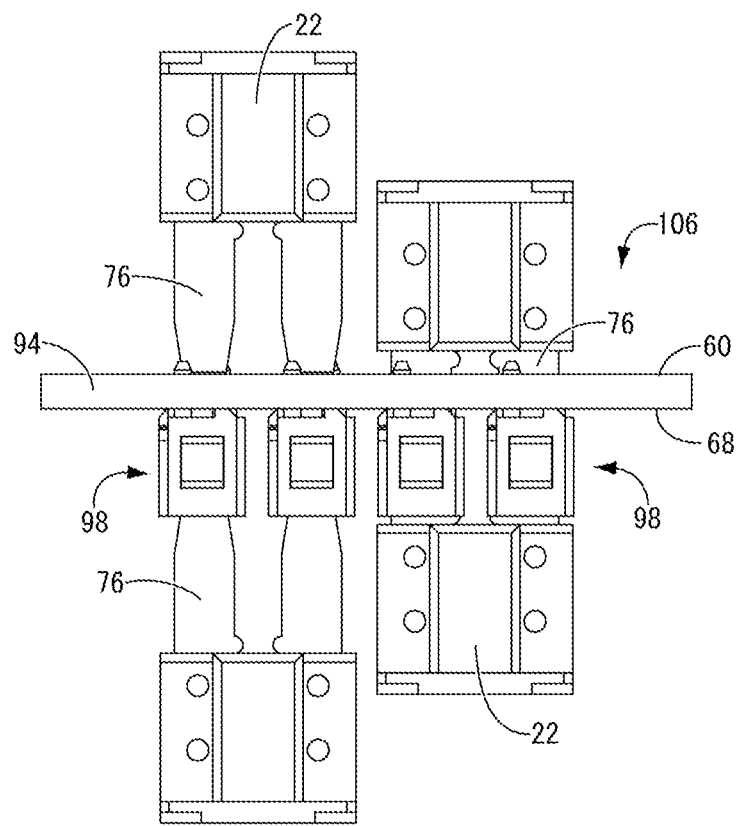
FIG. 14 is a side view of the printed board with board terminal of the fourth aspect.

With reference now to FIGS. 13 and 14, a fourth aspect of a printed board with board terminal 106 is provided. Note that a case 12 is not shown in FIGS. 13 and 14 to facilitate understanding. The printed board with board terminal 106 differs in configuration from the above third aspect in that fuses 22 are mounted on both surfaces, i.e. on a first surface 60 and a second surface 68 of a printed board 94.

According to this aspect, tab terminals 76 of two fuses 22 shown on a back side of FIG. 13 can be inserted into and connected to insertion holes 38 of board terminals 98 from the side of the first surface 60 of the printed board 94 as in the third aspect. On the other hand, tab terminals 76 of two fuses 22 shown on a front side of FIG. 13 can be inserted into and connected to insertion holes 38 of board terminals 98 from the side of the second surface 68 of the printed board 94 as in a conventional way. Thus, in the case of mounting the fuses 22 on the both surfaces 60, 68 of the printed board 94, the board terminals 98 have only to stand only on the second surface 68 of the printed board 94 unlike a conventional structure in which board terminals need to stand on the both surfaces 60, 68 of the printed board 94. Therefore, a height of the printed board with board terminal 106 can be drastically reduced.

Although a plurality of aspects of the present invention have been described in detail above, the present invention is not limited by the specific description of these aspects. For example, although the connecting portion is formed by the pair of resilient tongue pieces 42 in the above aspects, it may be composed only of a single resilient tongue piece. The connecting portion may have any shape provided that it can be connected to the tab terminal 76.

The invention claimed is:

1. A printed board assembly for connecting an electrical component, the printed board assembly comprising:
    a printed board having a through hole into which a tab terminal of the electrical component is inserted;
    a terminal board having an insertion hole into which a tab terminal of the electrical component is inserted and a connecting portion which projects inwardly from the insertion hole and is pressed into contact with the tab terminal; and
    a tab terminal inserting portion including the through hole and the insertion hole, the tab terminal is formed by arranging the through hole of the printed board and the insertion hole of the board terminal such that the through hole and the insertion hole overlap each other in a plan view.

2. The printed board assembly as set forth in claim 1, further including a press-fit hole disposed on the printed circuit board adjacent the periphery of the through hole; and
    a press-fit tab disposed on the board terminal, wherein the board terminal is positioned and held on the printed board by press-fitting the press-fit tab into the press-fit hole.

3. The printed board with board assembly as set forth in claim 2, further including a land portion disposed on the printed board, the land portion being conductive to the conductive path; and
    a soldered portion disposed on the terminal board, the soldered portion configured to be placed on the land portion, wherein the soldered portion is placed on and soldered to the land portion.

\* \* \* \* \*